United States Patent
Sugii et al.

(10) Patent No.: US 9,971,460 B2
(45) Date of Patent: May 15, 2018

(54) ELECTROSTATIC CAPACITANCE-TYPE INPUT DEVICE

(71) Applicant: ALPS ELECTRIC CO., LTD., Ota-ku, Tokyo (JP)

(72) Inventors: Eiichi Sugii, Tokyo (JP); Yuya Kikuchi, Tokyo (JP); Tatsuo Koike, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 99 days.

(21) Appl. No.: 14/617,110

(22) Filed: Feb. 9, 2015

(65) Prior Publication Data

US 2015/0253900 A1     Sep. 10, 2015

(30) Foreign Application Priority Data

Mar. 7, 2014 (JP) ................................ 2014-045704
Mar. 19, 2014 (JP) ................................ 2014-056707

(51) Int. Cl.

| | | |
|---|---|---|
| *G06F 3/045* | (2006.01) | |
| *G06F 3/044* | (2006.01) | |
| *G06F 3/041* | (2006.01) | |
| *H03K 17/98* | (2006.01) | |

(52) U.S. Cl.
CPC ............ *G06F 3/044* (2013.01); *G06F 3/0414* (2013.01); *H03K 17/98* (2013.01); *H03K 2217/96076* (2013.01); *H03K 2217/960775* (2013.01)

(58) Field of Classification Search
CPC ....................................................... G06F 3/041
See application file for complete search history.

(56) References Cited

U.S. PATENT DOCUMENTS

| | | | |
|---|---|---|---|
| 8,110,767 B2 | 2/2012 | Yamauchi et al. | |
| 2005/0110196 A1* | 5/2005 | Yu ........................... | B29C 45/27 264/328.1 |
| 2007/0189039 A1* | 8/2007 | Yokota ................. | G02B 6/0036 362/619 |
| 2008/0303797 A1* | 12/2008 | Grothe .................... | G06F 3/016 345/173 |

(Continued)

FOREIGN PATENT DOCUMENTS

| | | |
|---|---|---|
| JP | 2004-355958 | 12/2004 |
| JP | 2008-041484 | 2/2008 |

(Continued)

*Primary Examiner* — Jonathan Boyd
*Assistant Examiner* — Carl Adams
(74) *Attorney, Agent, or Firm* — Hunton Andrews Kurth LLP

(57) ABSTRACT

An electrostatic capacitance-type input device includes a first member made of a non-conductive resin, a second member formed together with the first member and made of a conductive resin, a determination unit configured to determine the presence or absence of an input operation of an operator for the second member, based on a change in electrostatic capacitance of the second member, a circuit substrate in which the determination unit is mounted, the circuit substrate being fixed to an inner side portion of a cover member, and a conductive elastic member configured to lie between the second member and the circuit substrate and maintain an electrical connection between the second member and the circuit substrate using an elastic force.

5 Claims, 7 Drawing Sheets

(56) References Cited

U.S. PATENT DOCUMENTS

| | | | | |
|---|---|---|---|---|
| 2009/0207152 | A1* | 8/2009 | Nakamura | G06F 3/03547 345/174 |
| 2010/0265212 | A1* | 10/2010 | Sekiguchi | G06F 3/044 345/174 |
| 2010/0271328 | A1* | 10/2010 | Sekiguchi | G06F 3/0412 345/174 |
| 2014/0240618 | A1* | 8/2014 | Oraw | G06F 3/044 349/12 |

FOREIGN PATENT DOCUMENTS

| JP | 2008-059912 | 3/2008 |
|---|---|---|
| JP | 2010-179735 | 8/2010 |

\* cited by examiner

ELECTROSTATIC CAPACITANCE-TYPE INPUT DEVICE

CLAIM OF PRIORITY

This application contains subject matter related to and claims the benefit of Japanese Patent Application Nos. 2014-045704 filed on Mar. 7, 2014 and No. 2014-056707 filed on Mar. 19, 2014, the entire contents of which are incorporated herein by reference.

BACKGROUND OF THE DISCLOSURE

1. Field of the Disclosure

The present disclosure relates to an electrostatic capacitance-type input device that senses an input operation, based on a change in electrostatic capacitance.

2. Description of the Related Art

Japanese Unexamined Patent Application Publication No. 2010-179735 discloses an operation device for a vehicle air conditioner, in which a touch sensor sheet is stuck on the inner surface side of an operation panel. In this operation device, as the touch sensor sheet, a sensor based on an electrostatic capacitance method is used, and an input to the operation panel is determined by sensing the electrostatic capacitance of this sensor.

However, in the manufacturing of the operation device described in Japanese Unexamined Patent Application Publication No. 2010-179735, there is a process of sticking a touch sensor sheet of another member on the inner surface side of the operation panel, and it is necessary to accurately stick each time. Therefore, it has been difficult to enhance an assembling property.

These and other drawbacks exits.

SUMMARY OF THE DISCLOSURE

Embodiments of the present disclosure provide an electrostatic capacitance-type input device capable of realizing a simple structure while maintaining the degree of accuracy of an input, thereby enhancing an assembling property.

An electrostatic capacitance-type input device of the present disclosure includes a first member made of a non-conductive resin, a second member formed together with the first member and made of a conductive resin, a determination unit configured to determine the presence or absence of an input operation of an operator for the second member, based on a change in electrostatic capacitance of the second member, a circuit substrate in which the determination unit is mounted, the circuit substrate being fixed to an inner side portion of a cover member, and a conductive elastic member configured to lie between the second member and the circuit substrate and maintain an electrical connection between the second member and the circuit substrate using an elastic force.

Since, based on this configuration, it is possible to easily and correctly arrange the second member with respect to the first member, a process in which an electrostatic sensor sheet is correctly positioned and stuck in such a manner as in an input device of the related art and a process in which a sensor sheet and a circuit substrate are connected using soldering or the like become unnecessary. Therefore, it is possible to realize a simple structure while maintaining the degree of accuracy of an input, thereby enhancing an assembling property.

In the electrostatic capacitance-type input device of the present disclosure, the second member includes an operation region whose electrostatic capacitance is changed based on an input operation of the operator, at least an outer side portion of the operation region within the second member is covered by the first member, and the determination unit determines the presence or absence of an input operation of the operator for the operation region covered by the first member.

From this, it is possible to prevent static electricity from falling from a finger or the like of the operator to the second member. Furthermore, there becomes unnecessary a process in which a sheet serving as a countermeasure against electrostatic discharge (ESD) is provided in an operation surface in such a manner as in an input device of the related art. Therefore, it is possible to contribute to the enhancement of an assembling property.

In an electrostatic capacitance-type input device of the present disclosure, an LED is mounted, in the circuit substrate, at a position corresponding to an operation region whose electrostatic capacitance is changed based on an input operation of the operator and the first member includes a light guiding portion made of a light guiding resin and configured to guide outgoing light from the LED to the operation region.

From this, it is possible for the operator to identify each operation region. In addition, since it becomes possible to identify each operation region, based on an individual LED, it is unnecessary to provide a display or a member, used for identifying an operation region, on the first member. Therefore, it is possible to reduce the number of components.

In an electrostatic capacitance-type input device of the present disclosure, the first member and the second member are movable in accordance with elastic extension or contraction of the conductive elastic member with respect to the circuit substrate, a switch member configured to generate a signal corresponding to the presence or absence of a pressing force is mounted in the circuit substrate, and the switch member outputs a signal indicating an on-state in a case of being pressed by movements of the first member and the second member to a circuit substrate side, caused by the operator, and generates a signal of an off-state in a case where a pressing force caused by the first member and the second member is released.

Since, from this, it becomes possible to discriminate between a case where the operator unintentionally touches the input device and a case where the operator presses the operation region for an operation, it is possible to prevent an incorrect operation.

In an electrostatic capacitance-type input device of the present disclosure, the first member and the second member are integrated with each other by forming the first member after formation of the second member and a position of a gate of a mold for forming the first member is arranged at a position corresponding to an inner side portion of the light guiding portion.

By adopting this configuration, a resin flows from the inner side portion of the light guiding portion to the outer side portion thereof. Therefore, even if being melted by heat at the time of forming the first member, the already formed second member leaks out in only a direction away from the light guiding portion. Accordingly, it is possible to realize the shape of the light guiding portion in a desired shape, thereby enabling the light guiding performance thereof to be secured.

DETAILED DESCRIPTION OF THE DISCLOSURE

The following description is intended to convey a thorough understanding of the embodiments described by providing a number of specific embodiments and details involving a electrostatic capacitance-type input device. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Hereinafter, an electrostatic capacitance-type input device according to various embodiments of the present disclosure will be described in detail with reference to drawings.

Figure 1:
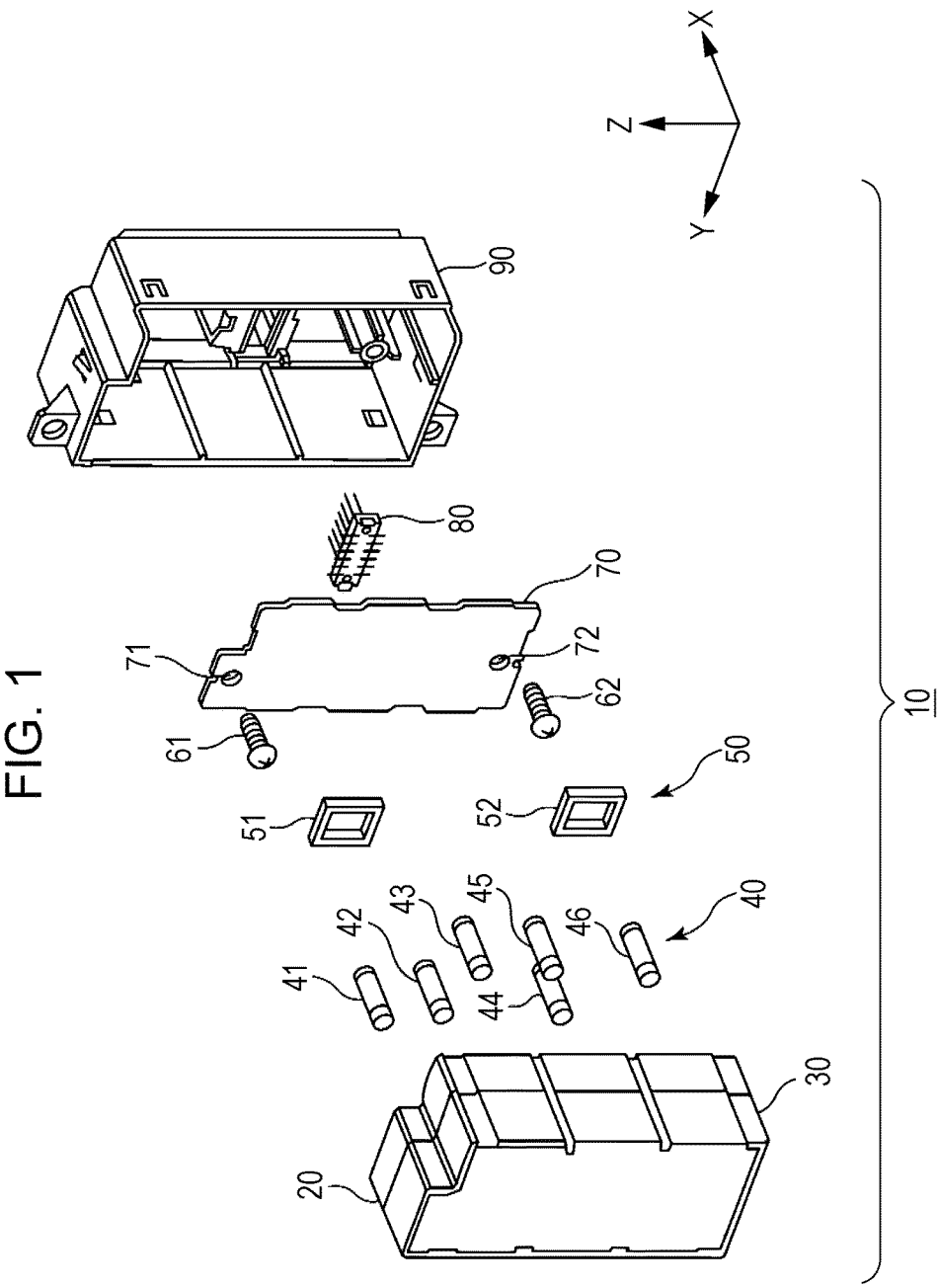
FIG. 1 is an exploded perspective view illustrating a configuration of an electrostatic capacitance-type input device according to an embodiment of the present disclosure.
Figure 2:
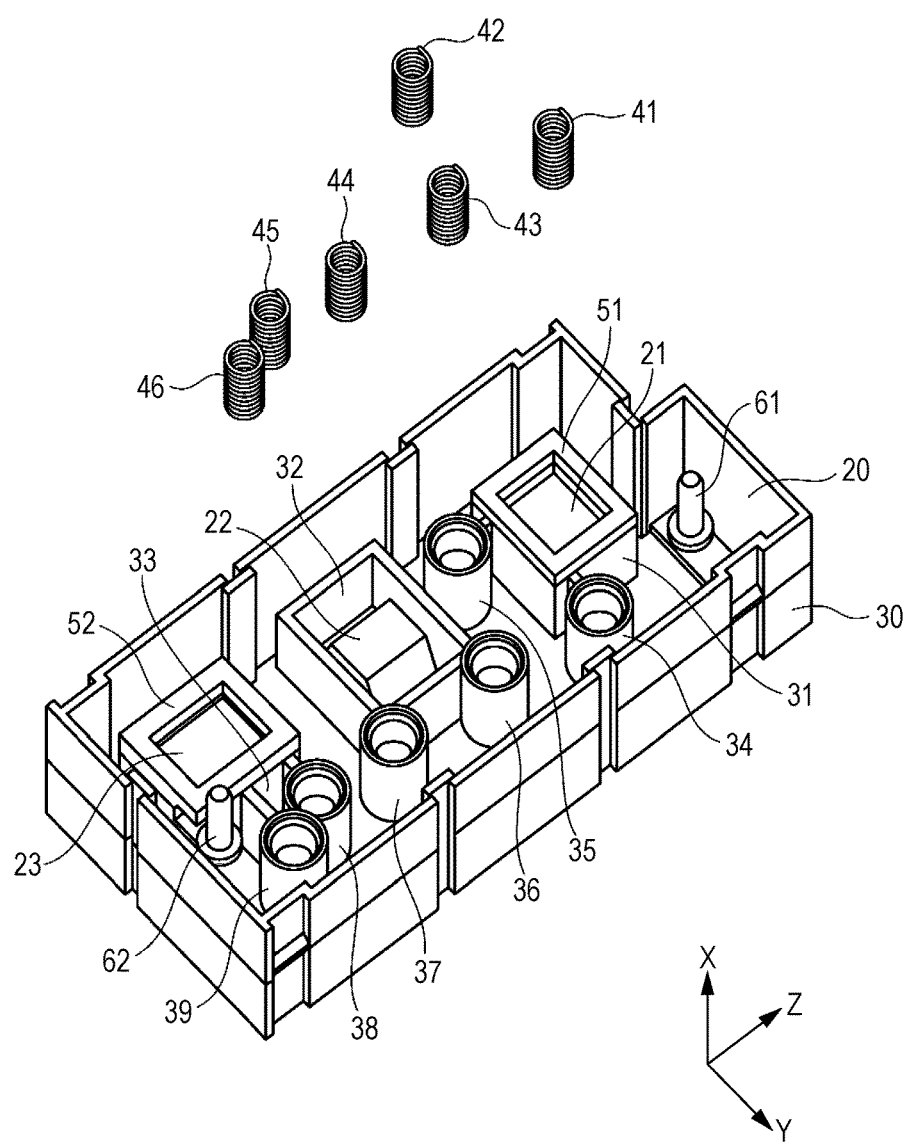
FIG. 2 is a perspective view illustrating a state in which cushions are arranged in a first member and a second member in the embodiment of the present disclosure.
Figure 3:
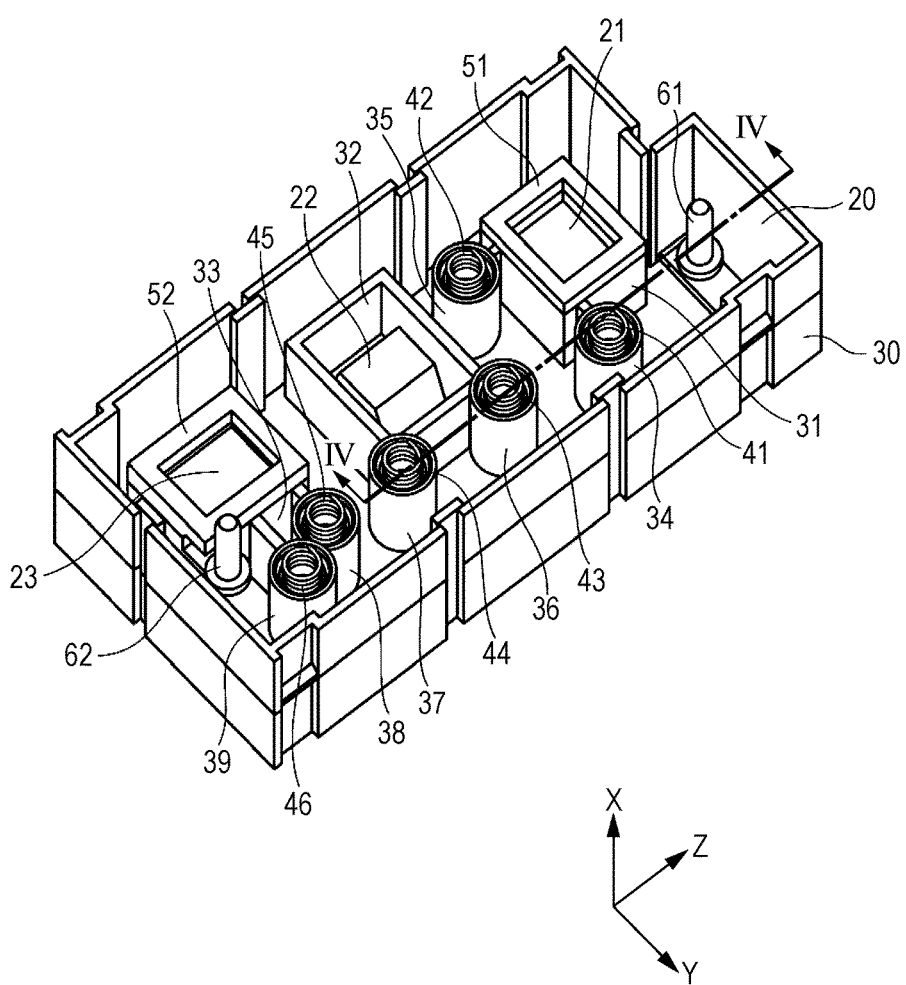
FIG. 3 is a perspective view illustrating a state in which springs are further arranged for the first member and the second member in FIG. 2.
Figure 4:
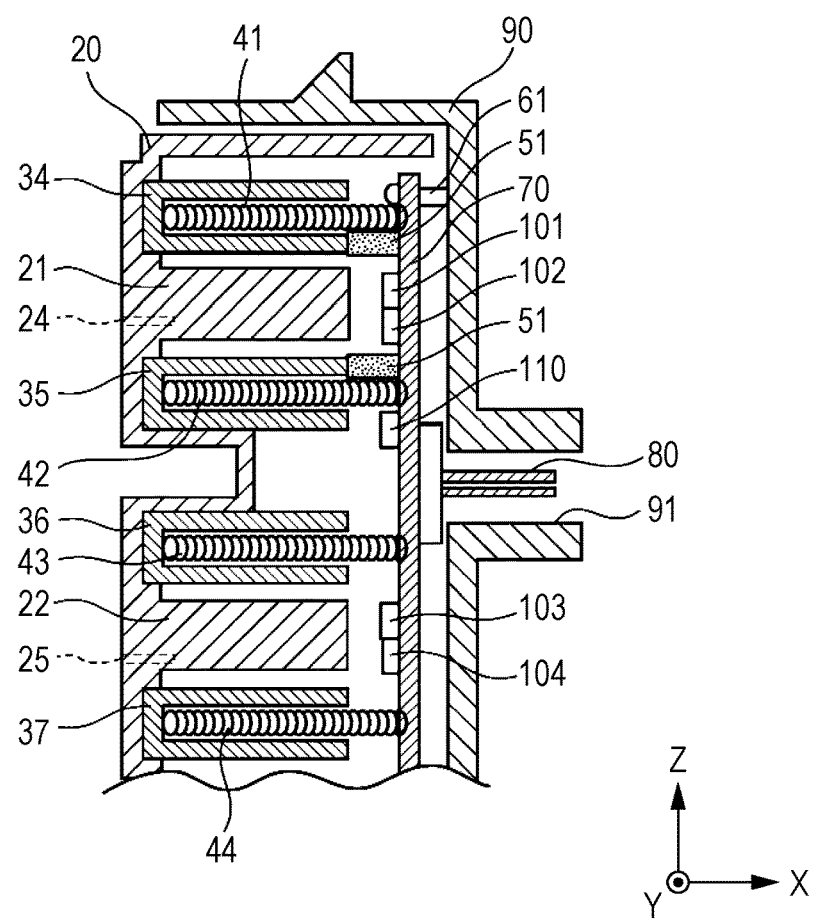
FIG. 4 is a partial cross-sectional view schematically illustrating a configuration of the electrostatic capacitance-type input device according to the embodiment of the present disclosure and corresponds to a cross-section taken along a line IV-IV in FIG. 3.
Figure 5:
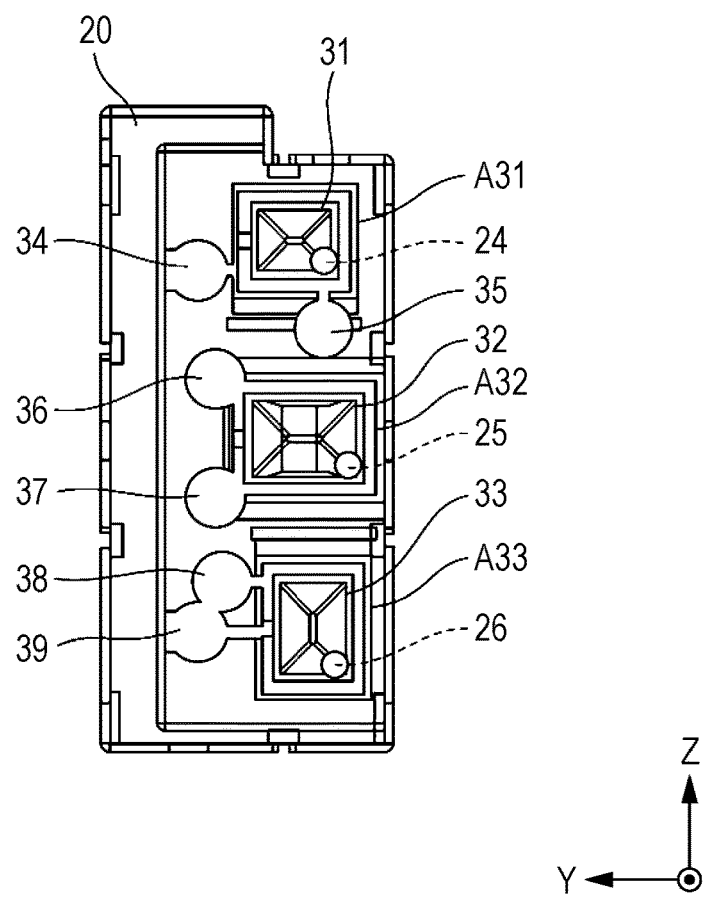
FIG. 5 is a front view illustrating an arrangement of the first member, the second member, and gate positions in the embodiment of the present disclosure.
Figure 6:
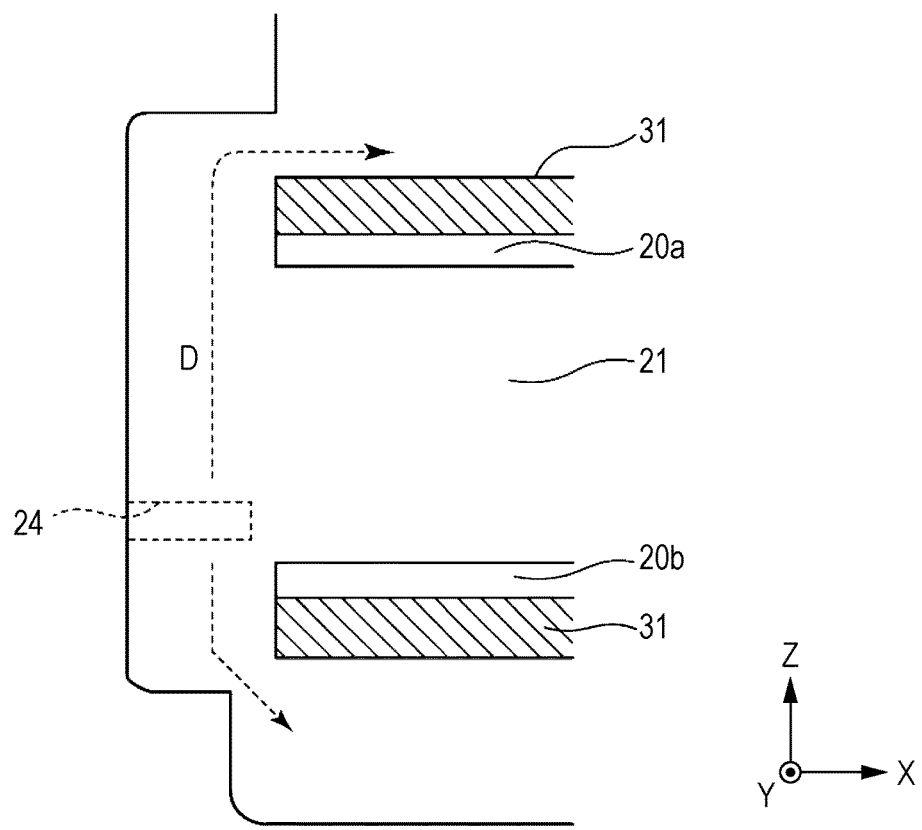
FIG. 6 is a cross-sectional view schematically illustrating the partial cross-sectional structure in FIG. 4.
Figure 7:
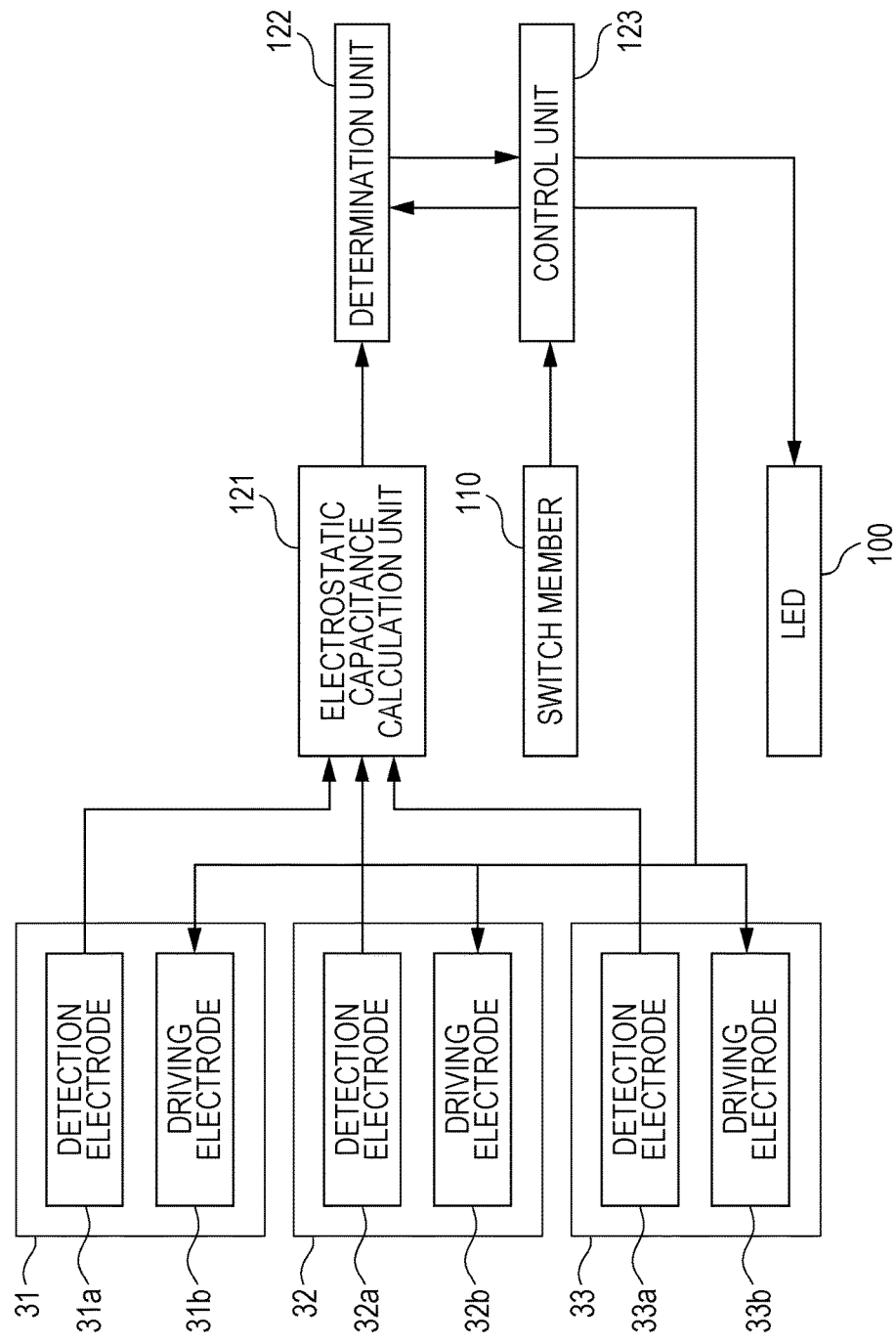
FIG. 7 is a block diagram illustrating a configuration of the electrostatic capacitance-type input device according to the embodiment of the present disclosure.

FIG. 1 is an exploded perspective view illustrating the configuration of an electrostatic capacitance-type input device 10 according to an example embodiment. FIG. 2 is a perspective view illustrating a state in which cushions are arranged in a first member 20 and a second member 30 in the electrostatic capacitance-type input device 10. FIG. 3 is a perspective view illustrating a state in which springs are further arranged for the first member and the second member in FIG. 2. FIG. 4 is a partial cross-sectional view schematically illustrating the configuration of the electrostatic capacitance-type input device 10 and corresponds to a cross-section taken along a line IV-IV in FIG. 3. FIG. 5 is a front view illustrating the arrangement of the first member 20, the second member 30, and gates 24, 25, and 26. FIG. 6 is a cross-sectional view schematically illustrating the partial cross-sectional structure in FIG. 4. FIG. 7 is a block diagram illustrating the configuration of the electrostatic capacitance-type input device 10.

As illustrated in FIG. 1, the electrostatic capacitance-type input device 10 may include the first member 20, the second member 30, a spring 40 serving as a conductive elastic member, a cushion 50, a circuit substrate 70, and a cover member 90. In addition, as illustrated in FIG. 7, the electrostatic capacitance-type input device 10 further may include an LED 100 (a light-emitting diode), a switch member 110, an electrostatic capacitance calculation unit 121, a determination unit 122, and a control unit 123. Hereinafter, individual members will be described in detail.

The first member 20 may be made of a resin having non-conductivity and a light guiding property, and the second member 30 may be made of a conductive resin. The non-conductive resin used for the first member 20 may be transparent, and the non-conductive resin may be, for example, acrylic, polycarbonate, polymethylmethacrylate and the like. The conductive resin used for the second member 30 may be black and may have a light blocking property, and a resin such as, for example, acrylic, polycarbonate, polymethylmethacrylate, and the like in which conductive particles such as carbon black are contained, may be used therefor.

The first member 20 and the second member 30 may be formed together by forming the first member 20 after the formation of the second member 30, and the second member 30 may be arranged within the first member 20. In other words, in an outer side portion in an X direction, the second member 30 may be cover by the first member 20. In the formation of the first member 20 and the second member 30, the second member 30 may be formed using, for example, a common mold and a first mold, and in the formation of the first member 20, a second mold and the common mold used for the formation of the second member 30 may be used. From this, it is possible to easily and correctly adjust the positions of the first member 20 and the second member 30, and it is possible to contribute to the enhancement of an assembling property. In addition, while, in the present embodiment, the second member 30 may be arranged within the first member 20 and the second member 30 may be covered by the first member 20, a configuration in which a portion of the second member 30 is located closest to a surface may be adopted. In this case, in terms of preventing electrostatic discharge, at least the outer side portions of operation regions A31, A32, and A33 (FIG. 5) in the X direction may be covered by the first member 20 having non-conductivity.

As illustrated in FIG. 2 to FIG. 4, the planar shape of the second member 30 when viewed in the X direction may include rectangular-shaped electrode frame portions 31, 32, and 33 and spring holding portions 34, 35, 36, 37, 38, and 39. The spring holding portions 34 and 35 may be formed so as to be connected to the periphery of the electrode frame portion 31, the spring holding portions 36 and 37 may be formed so as to be connected to the periphery of the electrode frame portion 32, and the spring holding portions 37 and 38 may be formed so as to be connected to the periphery of the electrode frame portion 33. Accordingly, the electrode frame portion 31 may be conductively connected to the spring holding portions 34 and 35, the electrode frame portion 32 may be conductively connected to the spring holding portions 36 and 37, and the electrode frame portion 33 may be conductively connected to the spring holding portions 38 and 39. The electrode frame portions 31, 32, and 33 and the spring holding portions 34, 35, 36, 37, 38, and 39 may be equal in height in the X direction. The electrode frame portions 31, 32, and 33 may not be conductively connected to one another, and may configure the independent operation regions A31, A32, and A33, the electrostatic capacitance of each of which may be changed based on an input operation of an operator, in the vicinity of the surface of the first member 20 (FIG. 5).

In addition, the first member 20 may include light guiding portions 21, 22, and 23 that protrude into the inner side thereof so as to correspond to the inner surface shapes of the electrode frame portions 31, 32, and 33, respectively. In addition, if it is possible to realize conduction states between electrode frame portions and spring holding portions that correspond to each other, the shapes of the electrode frame portions 31, 32, and 33, the formation positions of the spring holding portions 34, 35, 36, 37, 38, and 39 with the electrode frame portions 31, 32, and 33, and the number of spring holding portions are not limited to the shapes, arrangements, and the number illustrated in FIG. 3.

As illustrated in FIG. 5, gates 24, 25, and 26 of molds for forming the first member 20 may be arranged at positions corresponding to the inner side portions of the light guiding portions 21, 22, and 23. By adopting such an arrangement, a resin flows from the inner side portions of the light guiding portions 21, 22, and 23 to the outer side portions thereof. Therefore, even if being melted by heat at the time of forming the first member 20, the already formed second member 30 leaks out in only a direction away from the light guiding portions 21, 22, and 23. Accordingly, it is possible to form the light guiding portions 21, 22, and 23 in desired shapes, thereby enabling light guiding performance to be secured.

In addition, as illustrated in FIG. 6, the forming mold of the first member 20 may have such a shape as to form gaps 20a and 20b with the electrode frame portion 31 in a Z direction. Such a shape may be applied to the electrode frame portions 32 and 33 in the same way. From this, in a case illustrated in FIG. 6, a resin filled from the gate 24 flows around the electrode frame portion 31 as illustrated by an arrow D while not hitting the electrode frame portion 31 in the upward direction of the Z direction. Therefore, it becomes possible to prevent the second member 30 from leaking out owing to heat at the time of forming the first member 20.

As illustrated in FIG. 2, the spring 40 may include coil springs 41, 42, 43, 44, 45, and 46. The spring 40 may be configured by, for example, a metal material or configured by, for example, a material to have conductivity by subjecting the surface thereof formed by a resin to metal plating. As illustrated in FIG. 3, end portions of the coil springs 41, 42, 43, 44, 45, and 46 may be contained in the respective spring holding portions 34, 35, 36, 37, 38, and 39, and the other end portions thereof are arranged so as to come into contact with the circuit substrate 70 illustrated in FIG. 1.

The cushion 50 may be made of an elastic material (for example, rubber) and includes rectangular-shaped cushions 51 and 52 that have planar shapes corresponding to the respective end surface shapes of the electrode frame portions 31 and 33. The rectangular-shaped cushions 51 and 52 may be arranged between the electrode frame portions 31 and 33 and the circuit substrate 70.

The circuit substrate 70 may be a substrate in which the LED 100, the switch member 110, the electrostatic capacitance calculation unit 121, the determination unit 122, and the control unit 123 are mounted. The circuit substrate 70 may be fixed to the inner side portion of the cover member 90 by screws 61 and 62 penetrating hole portions 71 and 72, respectively, in the X direction. As illustrated in FIG. 4, a pin header 80 for wiring to the outside is provided in a rear face on the cover member 90 side of the circuit substrate 70, and the pin of the pin header 80 extends into the inside of a hole portion 91 provided in the cover member 90 and is electrically connected to an external device. The cover member 90 may be formed using a non-conductive resin such as, for example, acrylic, polycarbonate, may be polymethylmethacrylate or the like.

The LED 100 may include a plurality of LEDs provided at positions of causing rays of light to enter the respective light guiding portions 21, 22, and 23, and the operation of each of the LEDs may be controlled by the control unit 123 as illustrated in FIG. 7. More specifically, as illustrated in FIG. 4, LEDs 101 and 102 may be provided at positions of causing rays of light to enter the light guiding portion 21, LEDs 103 and 104 may be provided at positions of causing rays of light to enter the light guiding portion 22, and an LED, not illustrated, may be provided at a position of causing a ray of light to enter the light guiding portion 23. In this configuration, rays of outgoing light from the LEDs 101 and 102 pass through the light guiding portion 21 and are emitted from a corresponding point (the operation region A31) of the first member 20 to the outside, and rays of outgoing light from the LEDs 103 and 104 pass through the light guiding portion 22 and are emitted from a corresponding point (the operation region A32) of the first member 20 to the outside. Note that since the electrode frame portions 31 and 32 surrounding the light guiding portion 22 are black and have light blocking properties, rays of outgoing light from the LEDs 101 and 102 do not leak into the adjacent operation region A32 and rays of outgoing light from the LEDs 103 and 104 do not leak into the adjacent operation region A31, in the same way. From this, in the first member 20, positions corresponding to the electrode frame portions 31, 32, and 33 are individually illuminated and displayed by the corresponding LEDs, and it is possible for the operator to identify individual displays indicating the operation regions A31 to A33 corresponding to the electrode frame portions 31, 32, and 33, respectively.

The movement of the first member 20 in the X direction with respect to the cover member 90 may be regulated by the cover member 90 or an external member. From this, the coil springs 41 to 46 maintain, using the elastic forces thereof, states in which end portions thereof are in contact with the respective inner side portions of the spring holding portions 34 to 39 and the other end portions thereof may be in contact with corresponding conductive connection units of the circuit substrate 70. Therefore, the electrode frame portion 31 may be conductively connected to the circuit substrate 70 through the spring holding portions 34 and 35 and the coil springs 41 and 42, the electrode frame portion 32 may be conductively connected to the circuit substrate 70 through the spring holding portions 36 and 37 and the coil springs 43 and 44, and the electrode frame portion 33 may be conductively connected to the circuit substrate 70 through the spring holding portions 38 and 39 and the coil springs 45 and 46. In addition, the first member 20 may be movable to the inner side of the cover member 90 while maintaining conduction states between the second member 30, the spring 40, and the circuit substrate 70 using the elastic forces of the coil springs 41, 42, 43, 44, 45, and 46. Here, since two spring holding portions are connected to each of the electrode frame portions 31, 32, and 33, it is possible to reliably maintain conductive connections to the circuit substrate 70.

As illustrated in FIG. 1 and FIG. 4, the rectangular-shaped cushions 51 and 52 may be arranged between the electrode frame portions 31 and 33 and the circuit substrate 70. Therefore, even if the first member 20 moves to the inner side of the cover member 90, it is possible to prevent the electrode frame portions 31 to 33 and the spring holding portions 34 to 39 from being in contact with the circuit substrate 70. In addition, as illustrated in FIG. 4, on the circuit substrate 70, the switch member 110 may be provided at a position corresponding to the spring holding portion 35 in the Z direction. The switch member 110 may generate a signal corresponding to the presence or absence of a pressing force. The switch member 110 may output a signal indicating an on-state in a case of being pressed by the movements of the first member 20 and the second member 30 to the circuit substrate 70 side, caused by the operator. In addition, the switch member 110 may generate a signal indicating an off-state or no signal in a case where a pressing force caused by the first member 20 and the second member 30 is released. By providing such a switch member 110, it becomes possible to discriminate between a case where the operator unintentionally touches the electrode frame portions 31 to 33 and a case where the operator intentionally presses the electrode frame portions 31 to 33. In addition, the switch member may be arranged at a position corresponding to a spring holding portion other than the spring holding portion 35 or at a position corresponding to the electrode frame portion 32.

As illustrated in FIG. 7, the electrode frame portion 31 includes a detection electrode 31a and a driving electrode 31b, the electrode frame portion 32 may include a detection electrode 32a and a driving electrode 32b, and the electrode frame portion 33 may include a detection electrode 33a and a driving electrode 33b. While, here, regarding the measurement of electrostatic capacitance in the electrode frame portion 31, 32, or 33, the electrode frame portion 31 will be cited as an example and described, the same applies to the electrode frame portions 32 and 33. In other words, if a voltage is applied from the control unit 123 to the driving electrode 31b, a potential difference is generated between the detection electrode 31a and the driving electrode 31b, and a current flows through the detection electrode 31a in accordance with electrostatic capacitance (mutual capacitance) between the detection electrode 31a and the driving electrode 31b. Here, if a finger of the operator moves close to the detection electrode 31a, the finger and the detection electrode 31a are capacitively coupled to each other, thereby decreasing the electrostatic capacitance between the detection electrode 31a and the driving electrode 31b by the amount thereof. Accordingly, the current that flows through the detection electrode 31a at the time of the application of a voltage is decreased. Therefore, it is possible to obtain, from the detection electrode 31a, an output signal corresponding to a distance between the finger and a sensing element. The output signal from the detection electrode 31a may be input to the electrostatic capacitance calculation unit 121. The electrostatic capacitance calculation unit 121 may calculate electrostatic capacitance data, based on the signal from the detection electrode 31a, and may output a calculation result to the determination unit 122. Based on a change in electrostatic capacitance in the electrode frame portion 31, received from the electrostatic capacitance calculation unit 121, the determination unit 122 may determine the presence or absence of an input operation of the operator for the electrode frame portion 31. In other words, the determination unit 122 may determine the presence or absence of an input operation of the operator for the above-mentioned operation region covered by the first member 20 (a region where the electrode frame portion 31 is projected onto the first member 20).

In addition, based on a change in electrostatic capacitance between the detection electrode 31a and a grounding portion (GND), it is possible to identify the position of the finger. In other words, if the finger is not close to the detection electrode 31a, a current flows through the detection electrode 31a in accordance with parasitic capacitance between the detection electrode 31a and the grounding portion. In contrast, if the finger moves close to the detection electrode 31a, the detection electrode 31a to which the finger moves close and the finger are capacitively coupled to each other, thereby increasing electrostatic capacitance (self-capacitance) by the amount thereof. Accordingly, the current that flows through the detection electrode 31a at the time of the application of a voltage is increased. Therefore, it is possible to obtain, from the detection electrode 31a, an output signal corresponding to a distance between the finger and the sensing element.

The switch member 110 may be connected to the control unit 123. In a case where the switch member 110 is pressed and the signal indicating the on-state is output to the control unit 123, if the determination of the presence or absence of an input operation, performed by the determination unit 122, has been started, the control unit 123 may cause this to be continued. In addition, if the determination of the presence or absence of an input operation has not been started, the control unit 123 may cause the determination to be started. In contrast, in a case where the switch member 110 is not pressed, thereby outputting a signal indicating an off-state from the switch member 110, or in a case where an on-signal is not output from the switch member 110, the control unit 123 may instruct the determination unit 122 not to start the determination of the presence or absence of an input operation if the determination has not been started. In addition, if the determination has been started, the control unit 123 may output a signal for instructing to stop the determination and the determination unit 122 may be put into a state of not performing the determination.

In the electrostatic capacitance-type input device 10 having the above-mentioned configuration, the contents of instructions may be displayed in the respective operation regions A31 to A33 by corresponding LEDs. In addition, if, in response to this, using a finger or the like, the operator presses an operation region corresponding to the desired content of an instruction, the determination unit 122 determines that an input operation is performed on the relevant operation region. The control unit 123 may output, to an external device, an instruction signal corresponding to the operation region where the determination unit 122 determines that an input operation may be performed.

By being configured as described above, according to the above-mentioned embodiment, the following advantageous effects are achieved. (1) By adopting a configuration in which the first member 20 made of a non-conductive resin and the second member 30 made of a conductive resin may be formed together and an electrical connection (conductive connection) between the second member 30 and the circuit substrate may be secured by the spring 40 serving as an elastic member having conductivity, a process in which an electrostatic sensor sheet is correctly positioned and stuck in such a manner as in an input device of the related art and a process in which a sensor sheet and a circuit substrate are connected using soldering or the like become unnecessary. Therefore, it is possible to enhance an assembling property.

(2) Since the second member 30 whose electrostatic capacitance may be changed based on the contact of a finger of the operator may be covered by the first member 20 having non-conductivity, an operation surface may be configured by a non-conductive resin. Therefore, it is possible to prevent static electricity from falling to the second member 30. From this, in an operation surface, a sheet serving may be provided as a countermeasure against electrostatic discharge (ESD) in such a manner as in an input device of the related art. Therefore, it is possible to provide an input device whose assembling property is high.

(3) LEDs may be individually mounted at positions corresponding to the operation regions A31 to A33 in the circuit substrate 70 and the light guiding portions 21, 22, and 23 each having a light guiding property may be arranged between the LEDs and the operation regions A31 to A33. Therefore, rays of outgoing light from the LED 100 may be guided to the light guiding portions 21, 22, and 23 and lead to the respective operation regions A31 to A33. From this, it is possible for the operator to identify individual operation regions. In the electrostatic capacitance-type input device 10 of the above-mentioned embodiment, since the second member 30, which includes the electrode frame portions 31, 32, and 33 specifying the operation regions A31 to A33, and the first member 20 may be formed together, a process in which another member is prepared and assembled with accuracy in such a manner as in an input device of the related art becomes unnecessary. Therefore, it becomes possible to enhance an assembling property while maintaining the visibility and the operability of an operation region.

(4) The spring 40 may be caused to lie between the second member 30 and the circuit substrate 70, thereby enabling the first member 20 and the second member 30 to move in the X direction in accordance with the elastic force of the spring 40, and using the switch member 110 provided on the circuit substrate 70, it is possible to determine whether or not the first member 20 and the second member 30 are pressed into the circuit substrate 70 side. In addition, the second member 30 and the circuit substrate 70 may be electrically connected to each other by causing the spring 40 having conductivity to lie therebetween. In other words, since it is possible to cause the spring 40, used for releasing a pressing force on the switch member 110, to double as an electrical connection, it is possible to enhance an assembling property by reducing the number of components. In addition, since it becomes possible to discriminate between a case where the operator unintentionally touches an operation region and a case where the operator intentionally presses the operation region, it is possible to prevent an incorrect operation.

While the present invention has been described with reference to the above-mentioned embodiment, the present invention is not limited to the above-mentioned embodiment, and modifications or alterations may occur within the scope of the purposes of improvements or the concept of the present invention.

As described above, an electrostatic capacitance-type input device according to the present invention is useful in that it is possible to enhance an assembling property while maintaining detection performance for an operation of an operator.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. An electrostatic capacitance-type input device comprising:
    a first member made of a non-conductive resin;
    a second member formed together with the first member and made of a conductive resin;
    a determination unit that determines the presence or absence of an input operation of an operator for the second member, based on a change in electrostatic capacitance of the second member;
    a circuit substrate in which the determination unit is mounted, the circuit substrate being fixed to an inner side portion of a cover member; and
    a coil spring that lies between the second member and the circuit substrate and maintains an electrical connection between the second member and the circuit substrate using an elastic force,
    the second member including an electrode frame portion and a spring holding portion that contains the coil spring.

2. The electrostatic capacitance-type input device according to claim 1, wherein
    the second member includes an operation region whose electrostatic capacitance is changed based on an input operation of the operator,
    at least an outer side portion of the operation region within the second member is covered by the first member, and
    the determination unit determines the presence or absence of an input operation of the operator for the operation region covered by the first member.

3. The electrostatic capacitance-type input device according to claim 1, wherein
    an LED is mounted, in the circuit substrate, at a position corresponding to an operation region whose electrostatic capacitance is changed based on an input operation of the operator, and
    the first member includes a light guiding portion made of a light guiding resin and configured to guide outgoing light from the LED to the operation region.

4. The electrostatic capacitance-type input device according to claim 3, wherein
    the first member and the second member are integrated with each other by forming the first member after formation of the second member, and
    a position of a gate of a mold for forming the first member is arranged at a position corresponding to an inner side portion of the light guiding portion.

5. The electrostatic capacitance-type input device according to claim 1, wherein
    the first member and the second member are movable in accordance with elastic extension or contraction of the conductive elastic member with respect to the circuit substrate,
    a switch member that generates a signal corresponding to the presence or absence of a pressing force is mounted in the circuit substrate, and
    the switch member outputs a signal indicating an on-state in a case of being pressed by movements of the first member and the second member to a circuit substrate side, caused by the operator, and generates a signal of an off-state in a case where a pressing force caused by the first member and the second member is released.

* * * * *